United States Patent
Ishii et al.

(10) Patent No.: US 10,816,619 B2
(45) Date of Patent: Oct. 27, 2020

(54) COUCHTOP ATTACHMENT-DETACHMENT TYPE RF COIL AND MAGNETIC RESONANCE IMAGING APPARATUS

(71) Applicant: Toshiba Medical Systems Corporation, Otawara-shi (JP)

(72) Inventors: Manabu Ishii, Otawara (JP); Sadanori Tomiha, Nasushiobara (JP); Shinji Mitsui, Nasushiobara (JP); Mitsuo Takagi, Otawara (JP); Miyuki Ota, Otawara (JP); Satoshi Imai, Nasushiobara (JP)

(73) Assignee: Canon Medical Systems Corporation, Otawara-shi (JP)

(*) Notice: Subject to any disclaimer, the term of this patent is extended or adjusted under 35 U.S.C. 154(b) by 332 days.

(21) Appl. No.: 15/362,247

(22) Filed: Nov. 28, 2016

(65) Prior Publication Data

US 2017/0153304 A1 Jun. 1, 2017

(30) Foreign Application Priority Data

Nov. 30, 2015 (JP) .................. 2015-233610

(51) Int. Cl.
*G01R 33/34* (2006.01)
*G01R 33/30* (2006.01)
*G01R 33/3415* (2006.01)
*G01R 33/36* (2006.01)

(52) U.S. Cl.
CPC ..... *G01R 33/34007* (2013.01); *G01R 33/307* (2013.01); *G01R 33/3415* (2013.01); *G01R 33/3642* (2013.01)

(58) Field of Classification Search
None
See application file for complete search history.

(56) References Cited

U.S. PATENT DOCUMENTS

| | | | | |
|---|---|---|---|---|
| 4,712,067 A | * | 12/1987 | Roschmann | G01R 33/34046 324/318 |
| 7,642,779 B2 | | 1/2010 | Ishihara et al. | |
| 9,545,218 B2 | * | 1/2017 | Ota | A61B 5/0555 |
| 10,353,024 B2 | * | 7/2019 | Tomiha | G01R 33/3415 |
| 2003/0076101 A1 | * | 4/2003 | Sakuma | G01R 33/34046 324/318 |

(Continued)

FOREIGN PATENT DOCUMENTS

| | | |
|---|---|---|
| JP | 2005-87523 | 4/2005 |
| JP | 2006-014823 A | 1/2006 |

(Continued)

OTHER PUBLICATIONS

Office Action dated Nov. 5, 2019, in Japanese Patent Application No. 2015-233610, filed Nov. 30, 2015.

*Primary Examiner* — Jermele M Hollington
(74) *Attorney, Agent, or Firm* — Oblon, McClelland, Maier & Neustadt, L.L.P.

(57) ABSTRACT

A couchtop attachment-detachment type RF coil according to an embodiment is attachable to and detachable from connector embedded in a couchtop of a magnetic resonance imaging apparatus, and forms a cable-free RF coil by being fitted with the connector and thereby joined with a coil element embedded in the couchtop, the cable-free RF coil corresponding to one area to be imaged of a subject.

4 Claims, 8 Drawing Sheets

(56) References Cited

U.S. PATENT DOCUMENTS

| | | | |
|---|---|---|---|
| 2009/0189610 A1* | 7/2009 | Li | G01R 33/34046 324/322 |
| 2011/0031970 A1* | 2/2011 | Ninomiya | A61B 5/055 324/309 |
| 2011/0169491 A1* | 7/2011 | Biber | G01R 33/3415 324/318 |
| 2012/0153954 A1* | 6/2012 | Ota | A61B 5/0555 324/318 |
| 2012/0161767 A1* | 6/2012 | Hardy | G01R 33/3642 324/318 |
| 2012/0161773 A1* | 6/2012 | Evers | G01R 33/3692 324/322 |
| 2013/0009644 A1 | 1/2013 | Kawai et al. | |
| 2013/0241547 A1* | 9/2013 | Biber | G01R 33/3415 324/307 |
| 2014/0012128 A1* | 1/2014 | Gross | A61B 5/0555 600/415 |
| 2014/0218034 A1* | 8/2014 | Ishii | G01R 33/3692 324/322 |
| 2015/0022208 A1* | 1/2015 | Biber | G01R 33/38 324/309 |
| 2015/0028873 A1* | 1/2015 | Dohata | G01R 33/3415 324/322 |
| 2016/0061916 A1* | 3/2016 | Duensing | G01R 33/34007 324/309 |
| 2016/0077172 A1* | 3/2016 | Duensing | G01R 33/34007 600/422 |
| 2017/0153303 A1* | 6/2017 | Tomiha | G01R 33/30 |

FOREIGN PATENT DOCUMENTS

| | | |
|---|---|---|
| JP | 2008-264497 | 11/2008 |
| JP | 2012-213581 | 11/2012 |

* cited by examiner

COUCHTOP ATTACHMENT-DETACHMENT TYPE RF COIL AND MAGNETIC RESONANCE IMAGING APPARATUS

CROSS-REFERENCE TO RELATED APPLICATIONS

This application is based upon and claims the benefit of priority from Japanese Patent Application No. 2015-233610, filed on 30 Nov. 2015; the entire contents of which are incorporated herein by reference.

FIELD

Embodiments described herein relate generally to couchtop attachment-detachment type radio frequency (RF) coil and a magnetic resonance imaging apparatus.

BACKGROUND

There are magnetic resonance imaging (MRI) apparatuses configured to excite spins of atomic nuclei in a subject placed in a static magnetic field with radio frequency (RF) pulses at the Larmor frequency and reconstruct an image from magnetic resonance (MR) signals generated as a result of this excitation.

DETAILED DESCRIPTION

A couchtop attachment-detachment type RF coil according to an embodiment is attachable to and detachable from a connector embedded in a couchtop of a magnetic resonance imaging apparatus, and forms a cable-free RF coil by being fitted with the connector and thereby joined with a coil element embedded in the couchtop, the cable-free RF coil corresponding to one area to be imaged of a subject.

The following describes a magnetic resonance imaging apparatus (hereinafter "MRI apparatus" as appropriate) according to the embodiment. Embodiments are not limited to the following embodiment.

Figure 1:
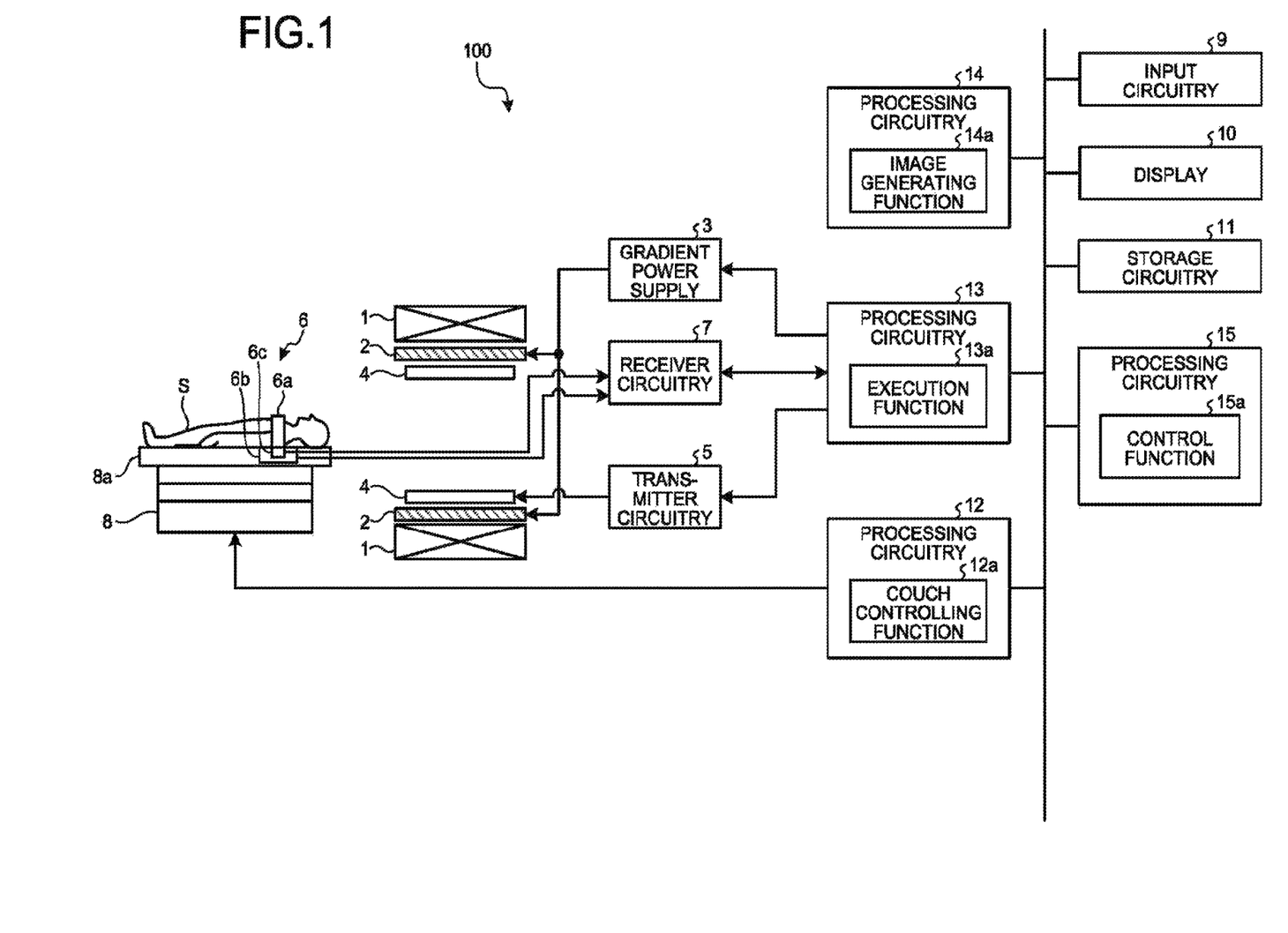
FIG. 1 is a functional block diagram illustrating the configuration of an MRI apparatus according to an embodiment.

FIG. 1 is a functional block diagram illustrating the configuration of an MRI apparatus 100 according to the embodiment. As illustrated in FIG. 1, the MRI apparatus 100 includes a static field magnet 1, a gradient coil 2, a gradient power supply 3, transmitter coil (radio frequency (RF) transmitting coil) 4, transmitter circuitry 5, receiver coil (RF receiving coil) 6, receiver circuitry 7, a couch 8, input circuitry 9, a display 10, storage circuitry 11, and processing circuitries 12 to 15. Note that a subject S (for example, a human body) illustrated in FIG. 1 is not included in the MRI apparatus 100. In addition, the configuration illustrated in FIG. 1 is merely an example.

The static field magnet 1 is substantially shaped like a hollow cylinder (the examples of which include a shape that has an elliptical section perpendicularly to the central axis of the cylinder), and generates a uniform static magnetic field in an imaging space formed facing the inner circumference thereof. For example, the static field magnet 1 is implemented in the form of a magnet such as a permanent magnet and a superconducting magnet.

The gradient coil 2 is substantially shaped like a hollow cylinder (the examples of which include a shape that has an elliptical section perpendicularly to the central axis of the cylinder), and is arranged at the inner circumferential side of the static field magnet 1. The gradient coil 2 includes three coils that generate gradient magnetic fields parallel to an x-axis, a y-axis and a z-axis, respectively, that are perpendicular to one another. Here, the x-axis, the y-axis, and the z-axis form an apparatus coordinate system unique to the MRI apparatus 100. For example, the direction of the x-axis is set vertical, and the direction of the y-axis is set horizontal. In addition, the direction of the z-axis is set the same as that of the magnetic flux of a static field magnet generated by the static magnetic field 1.

The gradient power supply 3 supplies current to the respective three coils included in the gradient coil 2 in different manners, thereby generating gradient magnetic fields parallel to the x-axis, the y-axis, and the z-axis in an imaging space. Gradient magnetic fields parallel to a readout direction, a phase encoding direction, and a slice direction that are perpendicular to one another can be generated as a result of appropriately generating gradient magnetic fields parallel to the x-axis, the y-axis, and the z-axis. Here, axes parallel to the readout direction, the phase encoding direction, and the slice direction form a logical coordinate system that is used for defining a slice region or a volume region to be imaged. Hereinafter, a gradient magnetic field parallel to the readout direction is referred to as a readout gradient, a gradient magnetic field parallel to the phase encoding direction is referred to as a phase encoding gradient, and a gradient magnetic field parallel to the slice direction is referred to as a slice gradient.

These gradient magnetic fields are used for being superimposed on a static magnetic field generated by the static field magnet 1 and providing magnetic resonance (MR) signals with spatial positional information. Specifically, the readout gradient changes the frequency of an MR signal in accordance with a position in the readout direction, thereby providing the MR signal with positional information along the readout direction. The phase encoding gradient changes the phase of an MR signal in the phase encoding direction, thereby providing the MR signal with positional information along the phase encoding direction. The slice gradient is used for determining the direction, the thickness, and the number of slice regions when an imaging region is a slice region. When a region to be imaged is a volume region, the slice gradient changes the phase of an MR signal in accordance with a position in the slice direction, thereby providing the MR signal with positional information along the slice direction.

The transmitter coil 4 is substantially shaped like a hollow cylinder (the examples which include a shape that has an elliptical section perpendicularly to the central axis of the cylinder), and is arranged at the inner side of the gradient coil 2. The transmitter coil 4 applies, to the imaging space, RF pulses output from the transmitter circuitry 5.

The transmitter circuitry 5 outputs RF pulses corresponding to the Larmor frequency to the transmitter coil 4. For example, the transmitter circuitry 5 includes oscillator circuitry, phase selector circuitry, frequency converter circuitry, amplitude modulator circuitry, and RF amplifier circuitry. The oscillator circuitry generates RF pulses at a resonant frequency unique to target atomic nuclei placed in a static magnetic field. The phase selector circuitry selects a phase of the RF pulses output from the oscillator circuitry. The frequency converter circuitry converts the frequency of RF pulses output from the phase selector circuitry. The amplitude modulator circuitry modulates the amplitude of RF pulses output from the frequency converter circuitry, by using, for example, a sinc function. The RF amplifier circuitry amplifies RF pulses output from the amplitude modulator circuitry and outputs the amplified RF pulses to the transmitter coil 4.

The receiver coil 6 is placed near the subject S, and receives MR signals emitted from the subject S under the influence of RF pulses. Upon receiving MR signals, the receiver coil 6 outputs the received MR signals to the receiver circuitry 7. Details of the receiver coil 6 according to the present embodiment are described later. The receiver coil 6 is an example of an RF coil described in the claims.

The receiver circuitry 7 generates MR signal data based on MR signals output from the receiver coil 6, and outputs the generated MR signal data to the processing circuitry 13. For example, the receiver circuitry 7 includes selector circuitry, preamplifier circuitry, phase detector circuitry, and analog-to-digital converter circuitry. The selector circuitry selectively inputs MR signals output from the receiver coil 6. The preamplifier circuitry amplifies MR signals output from the selector circuitry. The phase detector circuitry detects the phase of MR signals output from the preamplifier circuitry. The analog-to-digital converter circuitry converts analog signals, output from the phase detector circuitry, into digital signals, thereby generating MR signal data to output the generated MR signal data to the processing circuitry 13.

The case explained here is an example in which the transmitter coil 4 applies RF pulses while the receiver coil 6 receives MR signals. However, the transmitter coil and the receiver coil are not limited to such configurations. For example, the transmitter coil 4 may further include a reception function whereby MR signals are received. The receiver coil 6 also may further include a transmission function whereby an RF magnetic field is applied. When the transmitter coil 4 includes the reception function, the receiver circuitry 7 generates MR signal data also from MR signals received by the transmitter coil 4. When the receiver coil 6 includes the transmission function, the transmitter circuitry 5 outputs RF pulses to the receiver coil 6.

The couch 8 includes a couchtop 8a on which the subject S is placed, and inserts the couchtop 8a into an imaging space formed in the inside of the static field magnet 1 and the gradient coil 2 when the subject S is imaged. For example, the couch 8 is installed so that the longitudinal direction thereof can be parallel to the central axis of the static field magnet 1. Details of the couchtop 8a according to the present embodiment are described later.

The input circuitry 9 receives input operations for various instructions and various kinds of information, from an operator. For example, the input circuitry 9 is implemented in the form of a trackball, a switch button, a mouse, a keyboard, or a touch panel. The input circuitry 9 is connected to the processing circuitry 15 and converts the input operations, received from an operator, into electrical signals to output the electrical signals to the processing circuitry 15.

The display 10 displays thereon various kinds of information and various images. For example, the display 10 is implemented in the form of a liquid crystal monitor, a cathode ray tube (CRT) monitor, or a touch panel. The display 10 is connected to the processing circuitry 15 and converts the various kinds of information and data of the various images, transmitted thereto from the processing circuitry 15, into electrical signals to output the electrical signals.

The storage circuitry 11 stores therein various kinds of data. For example, the storage circuitry 11 stores MR signal data and image data with respect to each subject S. For example, the storage circuitry 11 is implemented in the form of a semiconductor memory element such as a random access memory (RAM) or a flash memory, a hard disk, or an optical disc.

The processing circuitry 12 includes a couch controlling function 12a. For example, the processing circuitry 12 is implemented in the form of a processor. The couch controlling function 12a is connected to the couch 8 and outputs electrical signals for control to the couch 8, thereby controlling moves of the couch 8. For example, the couch controlling function 12a receives from an operator, via the input circuitry 9, an instruction to move the couchtop 8a in the longitudinal direction thereof, upward or downward, or rightward or leftward, and actuates a drive mechanism for the couchtop 8a, which is included in the couch 8, so that the couchtop 8a can be moved in accordance with the received instruction.

The processing circuitry 13 includes an execution function 13a. For example, the processing circuitry 13 is implemented in the form f a processor. The execution function 13a executes various protocols. Specifically, the execution function 13a drives the gradient power supply 3, the transmitter circuitry 5, and the receiver circuitry 7 based on sequence execution data output from the processing circuitry 15, thereby executing the various protocols.

Here, the sequence execution data is information that defines a protocol indicating a procedure for acquiring MR signal data. Specifically, the sequence execution data is information that defines: timings of when the gradient power supply 3 supplies current to the gradient coil 2 and the strength of the current; timings of when the transmitter circuitry 5 supplies RF pulse current to the transmitter coil 4 and the strength of the RF pulse current; and detection timings of when the receiver circuitry 7 detects MR signals.

In addition, the execution function 13a receives MR signal data from the receiver circuitry 7 as a result of execution of any of the various pulse sequences, and stores the received MR signal data in the storage circuitry 11. A set of MR signal data received from the execution function 13a forms a k-space by being two-dimensionally or three-dimensionally arranged in accordance with positional information provided by the readout gradient, the phase encoding gradient, and the slice gradient that are described above, and is stored in the storage circuitry 11 as data that forms the k-space.

The processing circuitry 14 includes an image generating function 14a. For example, the processing circuitry 14 is implemented in the form of a processor. The image generating function 14a generates an image based on MR signal data stored in the storage circuitry 11. Specifically, the image generating function 14a reads out MR signal data stored in the storage circuitry 11 by the execution function 13a, and performs post-processing, that is, reconstruction processing such as Fourier transformation on the read-out MR signal data, thereby generating an image. In addition, the image generating function 14a stores image data of the generated image in the storage circuitry 11.

The processing circuitry 15 includes a control function 15a. For example, the processing circuitry 15 is implemented in the form of a processor. The control function 15a controls individual components included in the MRI apparatus 100, thereby controlling the MRI apparatus 100 as a whole. For example, the control function 15a receives from an operator, via the input circuitry 9, input of various parameters related to a pulse sequence, and generates sequence execution data based on the received parameters. The control function 15a then transmits the generated sequence execution data to the processing circuitry 13, thereby executing a corresponding one of the various pulse sequences. In addition, for example, the control function 15a reads out, from the storage circuitry 11, image data of an image as requested from an operator and outputs the read-out image to the display 10.

The term "processor" used in the above description means, for example, a central processing unit (CPU), a graphics processing unit (GPU), or circuitry such as an application specific integrated circuit (ASIC) or a programmable logical device (for example, a simple programmable logic device (SPLD), a complex programmable logic device (CPLD), or a field programmable gate array (FPGA)). Note that configuration to store a computer program in the storage circuitry 11 may be replaced by configuration to embed the computer program in circuitry of a processor. In such a case, the processor implements functions by reading out and executing the computer program embedded in the circuitry.

The entire configuration of the MRI apparatus 100 according to the embodiment is as described above.

Figure 2:
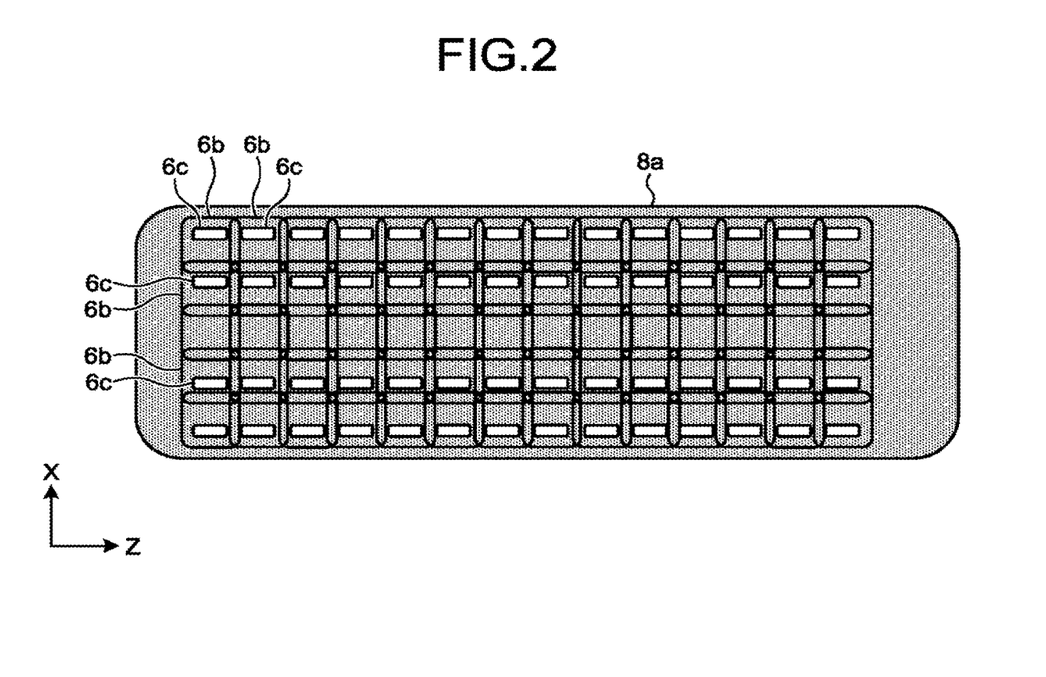
FIG. 2 is a diagram illustrating an example of a couchtop according to the embodiment.

Next, the couchtop 8a according to the present embodiment is described. FIG. 2 is a diagram illustrating an example of a couchtop according to the embodiment.

As illustrated in the example in FIG. 2, the couchtop 8a has a plurality of radio frequency coil elements 6b embedded therein. FIG. 2 illustrates an example in which, while there are five lines each having 14 radio frequency coil elements 6b arranged alongside one another in the z-axis direction, these five lines are arranged parallel to one another in the x-axis direction. That is, FIG. 2 illustrates an example in which the couchtop 8a has 70 radio frequency coil elements 6b embedded therein. Each of the radio frequency coil elements 6b has a loop-like shape. The radio frequency coil element 6b is connected to the receiver circuitry 7 via a cable. Each of the radio frequency coil elements 6b is a principal (main) part among parts (individual coil elements) that form each of the receiver coils 6, which is a radio frequency coil, and are therefore referred to also as a high frequency coil main part 6b. The radio frequency coil main parts 6b receive MR signals emitted from the subject S under the influence of RF pulses. Upon receiving MR signals, the radio frequency coil main parts 6b output the received MR signals to the receiver circuitry 7.

In addition, as illustrated in the example in FIG. 2, connectors 6c, to and from which radio frequency coil subsidiary parts 6a to be described later are attachable and detachable, are arranged inside loops of a certain number of (56 in this case) radio frequency coil main parts 6b. Each of the radio frequency coil main parts 6b is an example of a first element.

Figure 3:
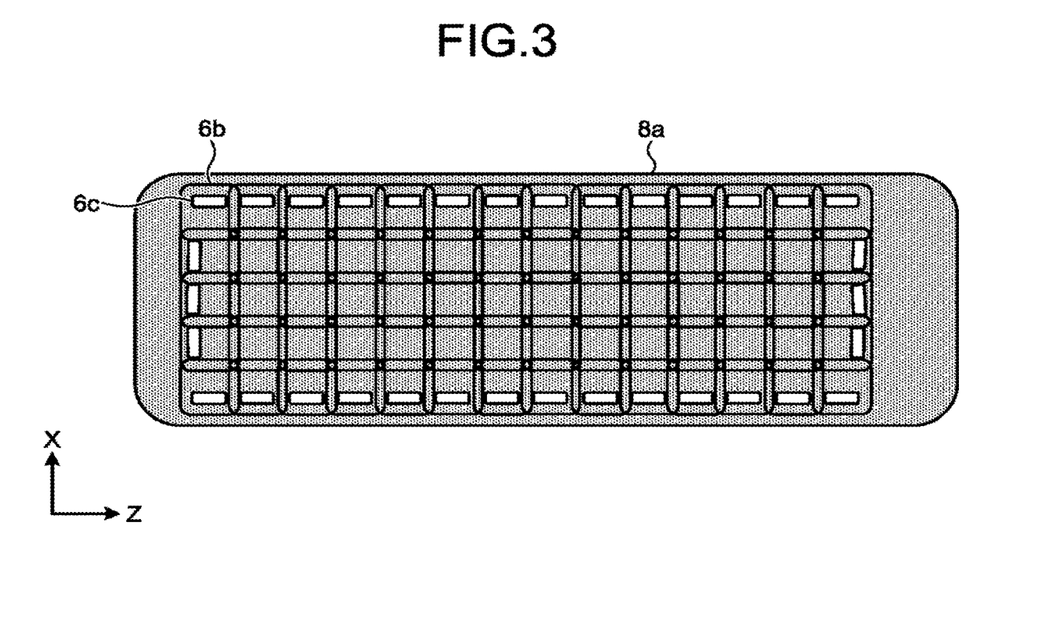
FIG. 3 is a diagram illustrating another example of the couchtop according to the embodiment.

FIG. 3 is a diagram illustrating another example of the couchtop according to the embodiment. In the couchtop 8a illustrated in FIG. 3 also, a plurality of radio frequency coil main parts 6b are embedded as in the couchtop 8a illustrated in the example in FIG. 2, and, while five lines each having 14 radio frequency coil elements 6b arranged alongside one another in the z-axis direction, these lines are arranged parallel to one another in the x-axis direction.

In addition, as illustrated in the example in FIG. 3, the connectors 6c are arranged in the inside of the loops of a certain number of (34 in this case) radio frequency coil main parts 6b. Furthermore, in the example in FIG. 3, six connectors 6c located at opposite ends in the z-axis directions are oriented differently from the other connectors 6c.

Figure 4:
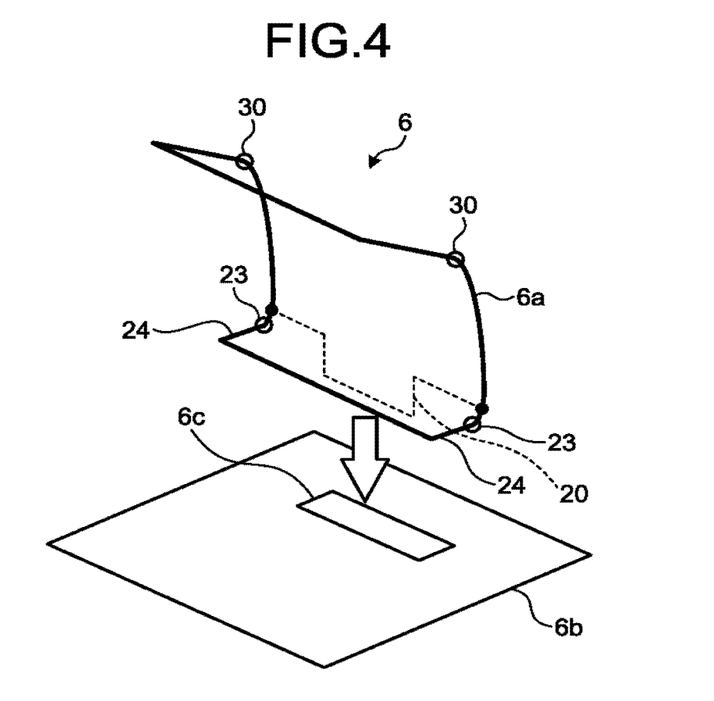
FIG. 4 is a diagram illustrating an example of a receiver coil according to the embodiment.

Next, the receiver coil 6 according to the present embodiment is described. FIG. 4 is a diagram illustrating an example of the receiver coil 6 according to the embodiment. As illustrated in the example in FIG. 4, the receiver coil 6 includes a plurality of radio frequency coil element including radio frequency coil elements 6a and radio frequency coil main parts 6b.

Each of the radio frequency coil elements 6a has a loop-like shape. The radio frequency coil element 6a is different from the radio frequency coil main part 6b in not being connected a cable, and includes a connector 20. That is, the radio frequency coil element 6a is cable-free. Note that, in the example of FIG. 4, when two sides from are considered, the connector 6c is placed in one side of the center of the loop of the radio frequency coil main part 6b while an imaging target is present in the other side thereof. Each of the radio frequency coil elements 6a is an auxiliary (subsidiary) part among parts (individual coil elements) that form one of the receiver coils 6, which is a radio frequency coil, and is therefore referred to also as a high frequency coil subsidiary part 6a. Each of the radio frequency coil subsidiary parts 6a is an example of a second element. The radio frequency coil subsidiary part 6a is also an example of a couchtop attachment-detachment type RF coil.

In the present embodiment, the connector 20 of each of the radio frequency coil subsidiary parts 6a is fit with one of the connectors 6c that is located at a position such that the radio frequency coil subsidiary part 6a can receive MR signals that would be emitted from an area to be imaged of the subject S. For example, the connector 20 is fit with one of the connectors 6c that is located at a position such that the radio frequency coil subsidiary part 6a can be attached to the imaged area. Consequently, one radio frequency coil element including one of the radio frequency coil main parts 6b and one of the radio frequency coil subsidiary parts 6a and corresponding to an area to be imaged of the subject S is formed. That is, by being fitted with one of the connectors 6c and thereby joined with the corresponding radio frequency coil main part 6b embedded in the couchtop 8a, each of the radio frequency coil subsidiary parts 6a forms a cable-free RF coil corresponding to an area to be imaged of the subject S.

For example, in the case of the radio frequency coil subsidiary part 6a configured as a coil element for imaging the head area, a radio frequency coil element constructed of this radio frequency coil subsidiary part 6a and one of the radio frequency coil main part 6b serves as a coil element for imaging the head area when the connector 6c fit with the connector 20 of this radio frequency coil subsidiary part 6a is arranged inside the loop of the one. In the case of the radio frequency coil subsidiary part 6a configured as a coil element for imaging the shoulder, a radio frequency coil element constructed of this radio frequency coil subsidiary part 6a and one of the radio frequency coil main parts 6b serves as a coil element for imaging the shoulder when the connector 6c fit with the connector 20 of this radio frequency coil subsidiary part 6a is arranged inside the loop of the one. In the case of the radio frequency coil subsidiary part 6a configured as a coil element for imaging the chest area, a radio frequency coil element constructed of this radio frequency coil subsidiary part 6a and one of the radio frequency coil main parts 6b serves as a coil element for imaging the chest area when the connector 6c fit with the connector 20 of this radio frequency coil subsidiary part 6a is arranged inside the loop of the one. That is, the kind of area to be imaged by each of the radio frequency coil main parts 6b changes according to the kind of area to be imaged that is an imaging target of the corresponding radio frequency coil subsidiary part 6a. In the present embodiment, there are at least two kinds of area to be imaged that is an imaging target of the radio frequency coil subsidiary parts 6a, and the radio frequency coil main parts 6b correspond to any of at least two kinds of area to be imaged. That is, in each of the couchtops 8a illustrated in FIG. 2 and FIG. 3, a plurality of the radio frequency coil main parts 6b are embedded so as to correspond to any of at least two kinds of area to be imaged.

In the present embodiment, under these conditions, the connectors 20 of the radio frequency coil subsidiary parts are fit with the connectors 6c arranged inside the loops of the radio frequency coil main parts 6b, so that the radio frequency coil subsidiary parts 6a are electrically joined with the receiver circuitry 7. That is, the radio frequency coil subsidiary parts 6a are joined with the receiver circuitry 7 by being fitted with the connectors 6c, so that one receiver circuitry that generates MR signal data based on MR signals emitted by the subject S is formed. This configuration enables construction of each of the receiver coils 6 without connecting a cable to the radio frequency coil subsidiary part 6a thereof.

Note that, as illustrated in FIG. 4, after the connector 20 has been fit with the connector 6c, the radio frequency coil subsidiary part 6a is kept bent at portions 30 in a direction that makes it closer to an area to be imaged, which is an imaging target. That is, after having been fit with the connector 6c, the radio frequency coil subsidiary part 6a is kept bent in a direction that makes it closer to an area to be imaged, which is an imaging target.

Figure 5:
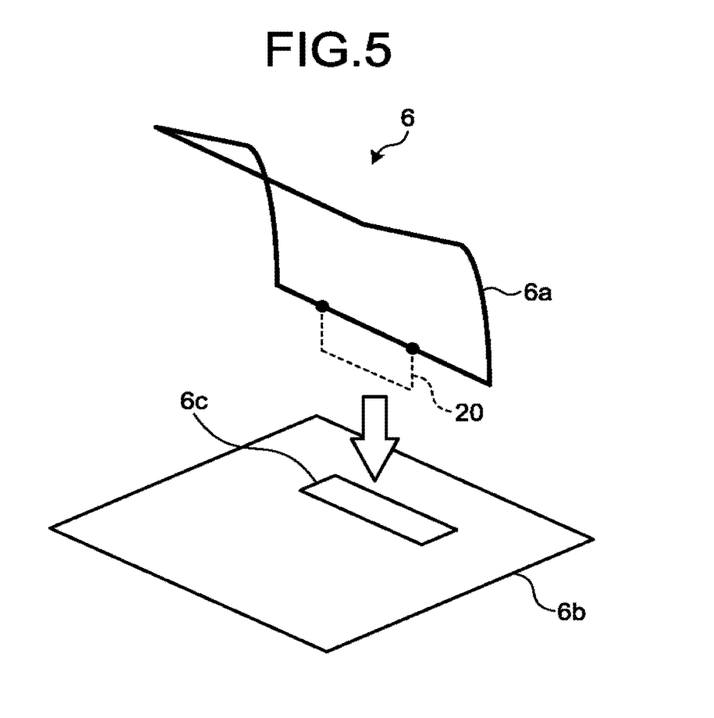
FIG. 5 is a diagram for explaining an example of a case in which two connectors are simply fit with each other.
Figure 6:
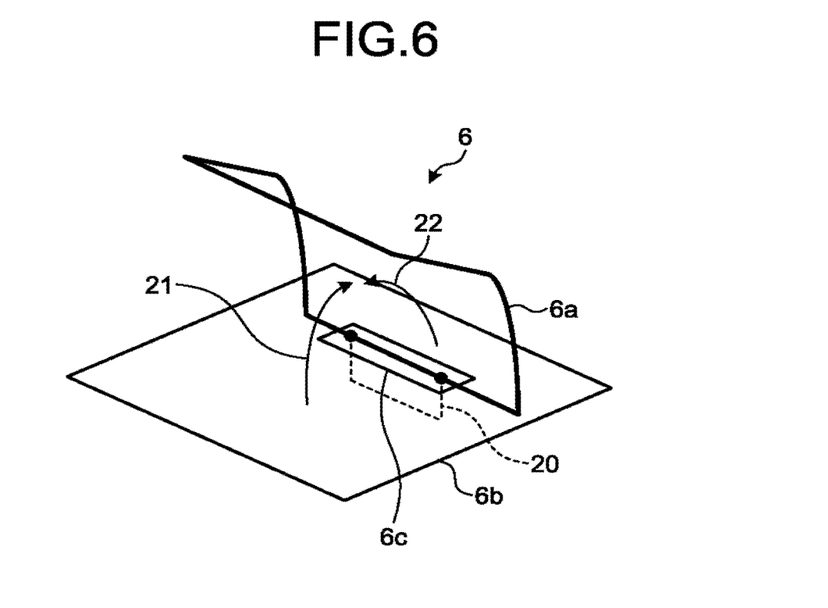
FIG. 6 is a diagram for explaining the example of a case in which two connectors are simply fit with each other.

Here, description is given of a case in which the connector 20 of the radio frequency coil subsidiary part 6a is simply fit with the connector 6c arranged inside the loop of the radio frequency coil main part 6b. FIG. 5 and FIG. 6 are diagrams for explaining an example of a case in which the two connectors are simply fit with each other.

When the connector 6c and the connector 20 have been simply fit with each other as illustrated in FIG. 5, the sizes of an interlinkage magnetic flux 21 and an interlinkage magnetic flux 22 that are linked from the front side and the back side, respectively, of the radio frequency coil subsidiary part 6a as illustrated in FIG. 6 are different, and the sum of radio frequency magnetic fields inside the loop of the radio frequency coil subsidiary part 6a is not equal to zero or nearly zero, in some cases. This may cause coupling between the radio frequency coil subsidiary part 6a and the radio frequency coil main part 6b.

For this reason, in the present embodiment, the receiver coil 6 is constructed as described below to prevent the above-described coupling, that is, to bring about decoupling.

Figure 7:
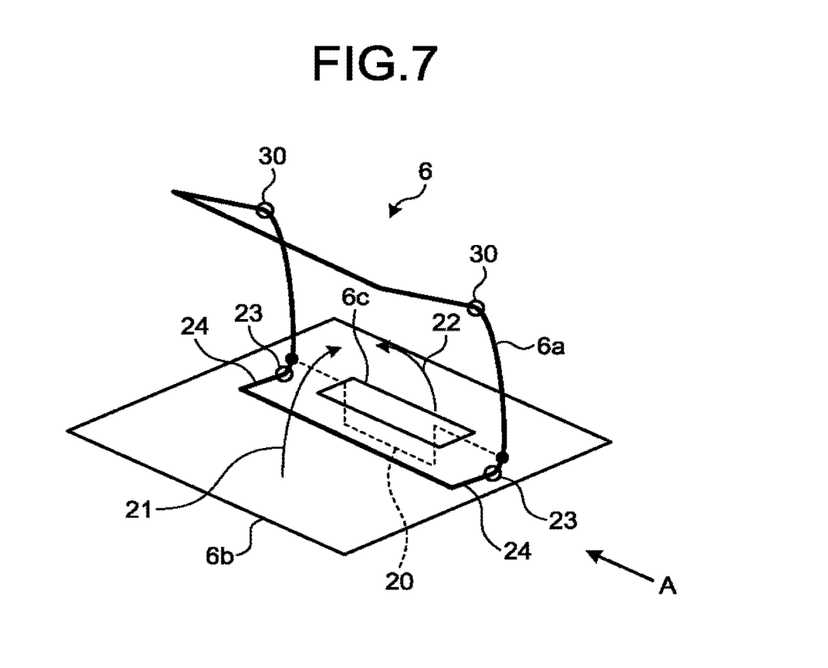
FIG. 7 is a diagram for explaining decoupling in the embodiment.
Figure 8:
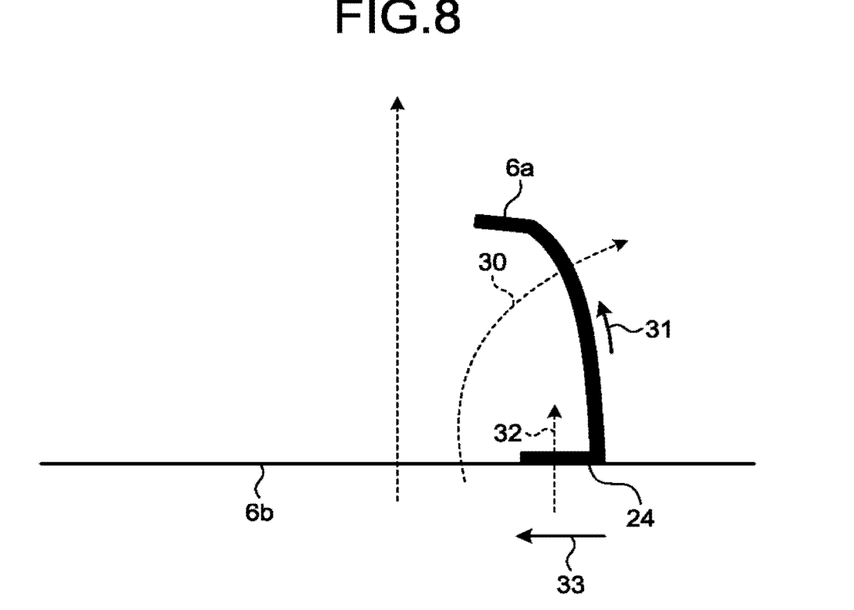
FIG. 8 is a diagram for explaining decoupling in the embodiment.

With reference to FIG. 4 again, portions 23 of the receiver coil 6 are bent, and extended portions 24 extend from these portions 23, in the present embodiment. The extended portions 24 are referred to also as bent portions. The extended portions 24 extend in the same direction as portions spanning from the above-described portions 30 to the front ends extend. Such a shape is referred to as, for example, a U-shape or C-shape. FIG. 7 and FIG. 8 are diagrams for explaining decoupling in the embodiment. When the connector 6c and the connector 20 are fit with each other, the extended portions 24 are arranged so that a region formed by the loop of the radio frequency coil main part 6b can overlap a region formed by the extended portions 24, as illustrated in the example in FIG. 7. That is, the radio frequency coil subsidiary part 6a is positioned so that, when having been fit with the connector 6c, the extended portions 24 of the loop of the soil element can overlap the radio frequency coil main part 6b embedded in the couchtop 8a. In this case, the area and the like of the region formed by the extended portions 24 are designed based on the position of the connector 6c inside the loop of the radio frequency coil main part 6b and the area size of the region formed by this loop so that the interlinkage magnetic flux 21 and the interlinkage magnetic flux 22 that are linked from the front side and the back side, respectively, of the radio frequency coil subsidiary part 6a can be equal or nearly equal to each other. Consequently, the size of the interlinkage magnetic flux 22 is increased as illustrated in the example in FIG. 7 as compared with the case illustrated in the example in FIG. 6, so that the sizes of the interlinkage magnetic flux 21 and the interlinkage magnetic flux 22 are the same or nearly the same. The sum of radio frequency magnetic fields inside the loop of the radio frequency coil subsidiary part 6a is therefore zero or nearly zero.

Here, decoupling is described in further detail with reference to FIG. 8. An example in FIG. 8 illustrates the receiver coil 6 viewed from a direction indicated by the arrow A in the example in FIG. 7. As illustrated in the example in FIG. 8, when a magnetic flux 30 of a magnetic field generated by the radio frequency coil main part 6b passes through the loop of the radio frequency coil subsidiary part 6a, current (current E1) flows in a direction indicated by the arrow 31 in a front-side part of the radio frequency coil subsidiary part 6a as viewed from the direction indicated by the above-described arrow A, in such a manner that this magnetic flux 30 is cancelled. Otherwise, as illustrated in the example in FIG. 8, when a magnetic flux 32 of a magnetic field generated by the radio frequency coil main part 6b passes through the region formed by the extended portions 24 of the radio frequency coil subsidiary part 6a, current (current E2) flows in a direction indicated by the arrow 33 in the extended portions 24 in the front-side part as viewed from the direction indicated by the above-described arrow A, in such a manner that this magnetic flux 32 is cancelled. In the present embodiment, under these conditions, decoupling can be brought about between the radio frequency coil subsidiary part 6a and the radio frequency coil main part 6b because the area and the like of the region formed by the extended portions 24 have been adjusted so that the current E1 and the current E2 can cancel each other. That is, coupling can be prevented between the radio frequency coil subsidiary part 6a and the radio frequency coil main part 6b.

Figure 9:
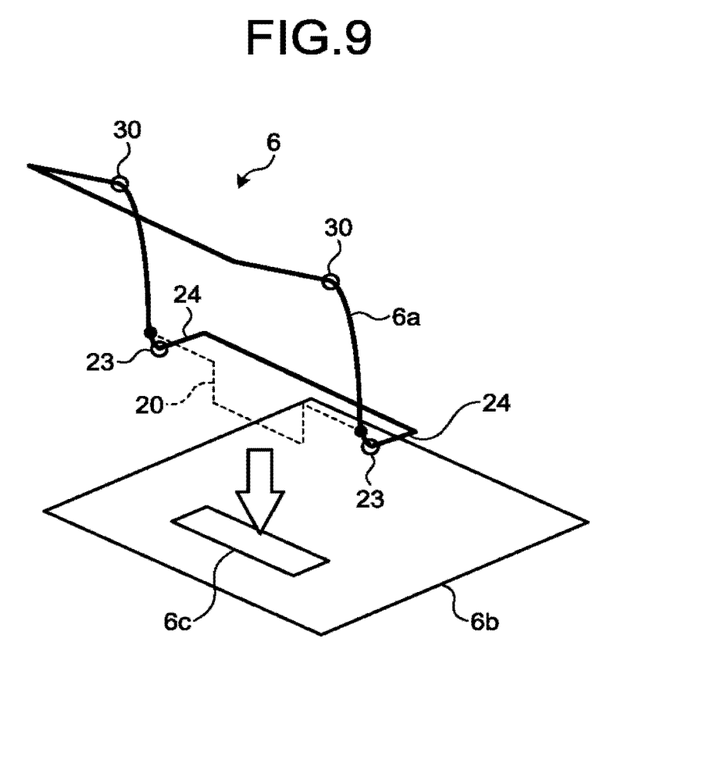
FIG. 9 is a diagram illustrating another example of the receiver coil according to the embodiment.

Next, an example of another coil element of the receiver coil 6 according to the present embodiment described. FIG. 9 is a diagram illustrating an example of the other coil element of the receiver coil 6 according to the embodiment. Differences thereof with the radio frequency coil element of the receiver coil 6 illustrated in the example in FIG. 4 and FIG. 7 are described. First, in the case of the radio frequency coil element of the receiver coil 6 illustrated in the example in FIG. 4 and FIG. 7, the connector 6c is placed in one side of the center of the loop of the radio frequency coil main part 6b while an imaging target is present in the other side thereof. In contrast, in the case of the radio frequency coil element of the receiver coil 6 illustrated in the example in FIG. 9, the connector 6c is placed in one side of the center of the loop of the radio frequency coil main part 6b while an imaging target is present in the same side. Next, the radio frequency coil element of the receiver coil 6 illustrated in FIG. 4 and FIG. 7 and the radio frequency coil element of the receiver coil 6 illustrated in FIG. 9 are different in that the portions 23 are bent in different directions.

Figure 10:
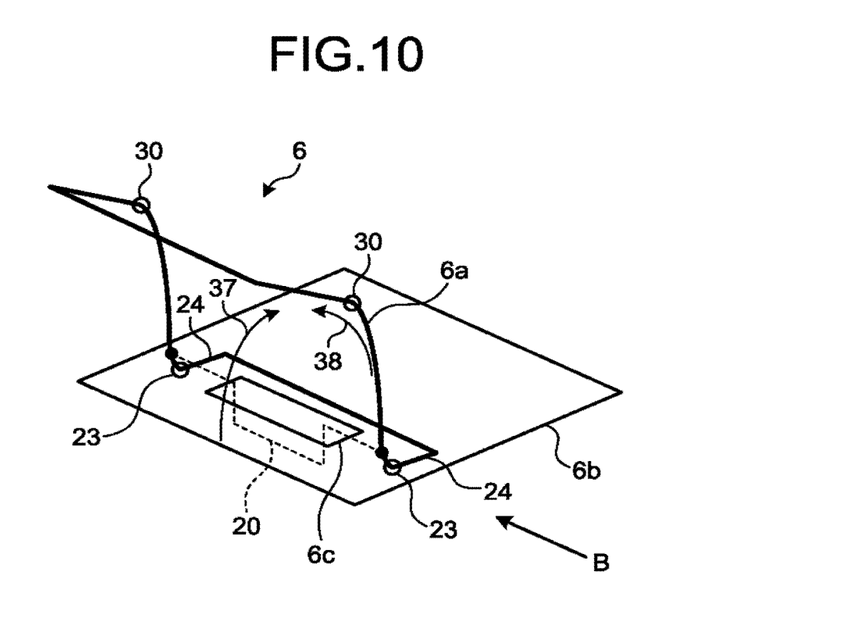
FIG. 10 is a diagram for explaining decoupling in the embodiment.
Figure 11:
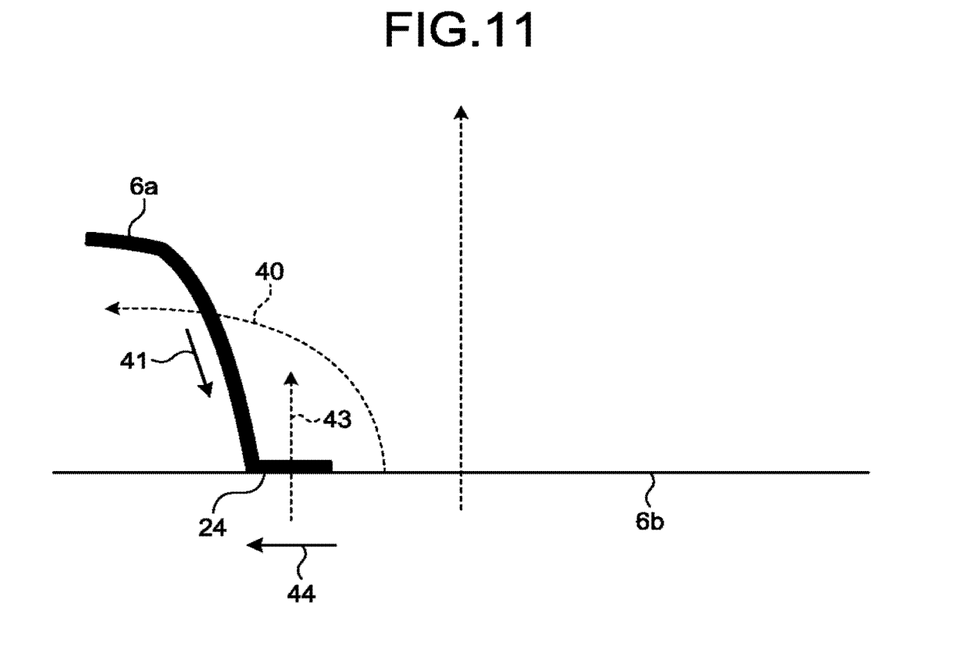
FIG. 11 is a diagram for explaining decoupling in the embodiment.

In the radio frequency coil element of the receiver coil 6 illustrated in FIG. 9, the portions 23 of the radio frequency coil subsidiary part 6a are bent, and the extended portions 24 extend from these portions 23. The extended portions 24 extend in a direction substantially opposite to the direction the portions spanning from the above-described portions 30 to the front ends extend. Such a shape is referred to as, for example, an S-shape. FIG. 10 and FIG. 11 are diagrams for explaining decoupling in the embodiment. When the connector 6c and the connector 20 are fit with each other, the extended portions 24 are arranged so that a region formed by the loop of the radio frequency coil main part 6b can overlap a region formed by the extended portions 24, as illustrated in the example in FIG. 10. In this case, the area and the like of the region formed by the extended portions 24 are designed based on the position of the connector 6c inside the loop of the radio frequency coil main part 6b and the area size of the region formed by this loop so that interlinkage magnetic flux 37 and interlinkage magnetic flux 38 that are linked from the front side and the back side, respectively, of the radio frequency coil subsidiary part 6a can be equal or nearly equal to each other. Consequently, as illustrated in the example in FIG. 10, the sizes of the interlinkage magnetic flux 37 and interlinkage magnetic flux 39 are the same or nearly the same. The sum of radio frequency magnetic fields inside the loop of the radio frequency coil subsidiary part 6a is therefore zero or nearly zero.

Here, decoupling is described in further detail with reference to FIG. 11. An example in FIG. 11 illustrates the receiver coil 6 viewed from the direction of the arrow B in the example in FIG. 10. As illustrated in the example in FIG. 11, when a magnetic flux 40 of a magnetic field generated by the radio frequency coil main part 6b passes through the loop of the radio frequency coil subsidiary part 6a, current (current E3) flows in a direction indicated by the arrow 41 in a front-side part of the radio frequency coil subsidiary part 6a as viewed from the direction indicated by the above-described arrow B, in such a manner that this magnetic flux 40 is cancelled. Otherwise, as illustrated in the example in FIG. 11, when a magnetic flux 43 of a magnetic field generated by the radio frequency coil main part 6b passes through the region formed by the extended portions 24 of the radio frequency coil subsidiary part 6a, current (current E4) flows in a direction indicated by the arrow 44 in the extended portions 24 in the front-side part as viewed from the direction indicated by the above-described arrow B, in such a manner that this magnetic flux 43 is cancelled. In the present embodiment, under these conditions, decoupling can be brought about between the radio frequency coil subsidiary part 6a and the radio frequency coil main part 6b because the area and the like of the region formed by the extended portions 24 have been adjusted so that the current E3 and the current E4 can cancel each other. That is, coupling can be prevented between the radio frequency coil subsidiary part 6a and the radio frequency coil main part 6b.

Figure 12:
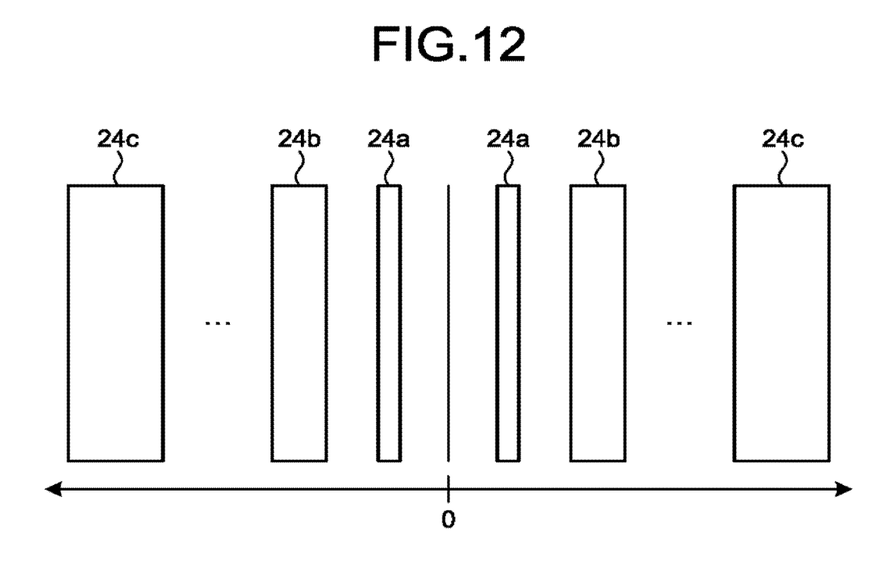
FIG. 12 is a diagram for explaining the area of a region formed by extended portions.

Next, the area of the region formed by the extended portions 24 is described. FIG. 12 is a diagram for explaining the area of the region formed by the extended portions 24. FIG. 12 is an example of the relation between: the distance from the centroid of the loop of the radio frequency coil main part 6b; and the area of the region formed by the extended portions 24 when the connector 20 is fit with the connector 6c arranged at a position that is this distance away from this centroid.

Note that the term "centroid" used here means, for example, a spatial centroid or the center of sensitivity of a region formed by the loop of the radio frequency coil main part 6b. As illustrated in the example in FIG. 12, when the distance from the centroid is "0", the area of the region formed by the extended portions 24 is "0". The area of a region 24a formed by the extended portions 24 when the distance from the centroid is relatively short is relatively small. The areas of a region 24b and a region 24c formed by the extended portions 24 when the distance from centroid is increased and when it is further increased, respectively, increase in accordance with the increase. The reason for this is as follows: because a magnetic flux of a magnetic field that is generated by the radio frequency coil main part 6b and passes through the region formed by the extended portions 24 is smaller as the distance from the centroid increases, a higher number of magnetic fluxes are allowed to pass through the region formed by the extended portions 24.

In addition, it is necessary to design a configuration that allows a higher number of magnetic fluxes to pass through the region formed by the extended portions 24 in order to bring about decoupling as the area of a region formed by the loop of the radio frequency coil subsidiary part 6a increases. For this reason, in the present embodiment, a configuration is designed so that the area of the region formed by the extended portions 24 can be larger when the area of a region formed by the loop of the radio frequency coil subsidiary part 6a is larger. That is, the size of each of the extended portions 24 in the radio frequency coil subsidiary part 6a is designed in accordance with the size of the entire loop of the radio frequency coil main part 6b. As described above, in the radio frequency coil subsidiary part 6a, the size of the extended portion 24 of the coil element is designed on the basis of the size of the entire loop of the radio frequency coil main part 6b embedded in the couchtop 8a.

Here, in the example in FIG. 12, when the distance from the centroid is "0", the area of the region formed by the extended portions 24 is "0" as described above. That is, when the radio frequency coil subsidiary part 6a is arranged at or near the center of the loop of the radio frequency coil main part 6b, for example, at a position the distance of which from the centroid is "0", it is not necessary that the radio frequency coil subsidiary part 6a be bent at the portions 23 and that the extended portions 24 be included. In this connection, the radio frequency coil element of the receiver coil 6 in such a case is described next with reference to FIG. 13.

Figure 13:
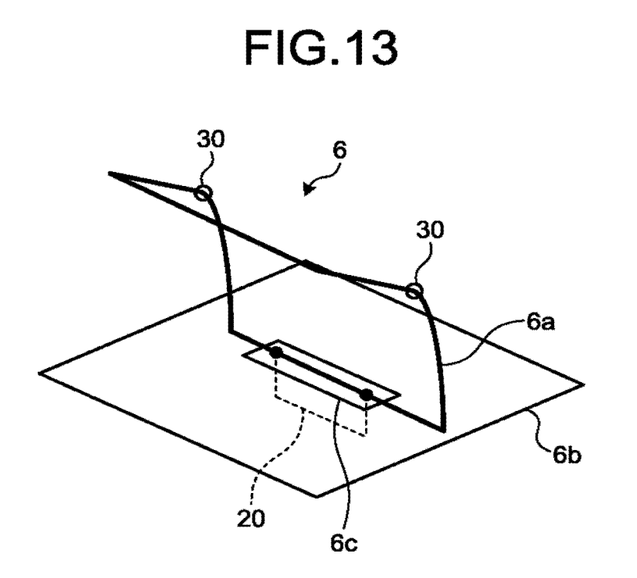
FIG. 13 is a diagram illustrating another example of receiver coil according to the embodiment.

FIG. 13 is a diagram illustrating another example of the radio frequency coil element of the receiver coil 6 according to the embodiment. The radio frequency coil element of the receiver coil 6 illustrated in FIG. 13 includes: the radio frequency coil subsidiary part 6*a* that has not include the extended portions 24; and the radio frequency coil main part 6*b*. The connector 6*c* is arranged at or near the center of the inside of the loop of the radio frequency coil main part 6*b*.

The radon frequency coil subsidiary part 6*a* illustrated in the example in FIG. 13 further includes the above-described connector 20. This connector 20 is fit with the connector 6*c*. In the example in FIG. 13, a radio frequency coil element of the receiver coil 6 includes the radio frequency coil main part 6*b* and the radio frequency coil subsidiary part 6*a*, and corresponds to one area to be imaged of a subject S. Under these conditions, the connector 20 of the radio frequency coil subsidiary part 6*a* is fit with the connector 6*c* arranged at or near the center of the inside of the loop of the radio frequency coil main part 6*b*, so that the radio frequency coil subsidiary part 6*a* is electrically joined with the receiver circuitry 7. This configuration enables construction of the receiver coil 6 without connecting a cable to the radio frequency coil subsidiary part 6*a*.

Furthermore, when the connector 20 of the radio frequency coil subsidiary part 6*a* is fit with the connector 6*c* arranged at or near the center of the inside of the loop of the radio frequency coil main part 6*b*, coupling therebetween is intrinsically unlikely to occur. Therefore, such coupling can be prevented with the connector 20 arranged at or near the center of the inside of the loop.

The receiver coil 6 and the MRI apparatus 100 according to the embodiment are as described above. The receiver coil 6 and the MRI apparatus 100 according to the embodiment, as described above, make it possible to prevent the coupling.

First Modification of Embodiment

Here, the radio frequency coil element of the receiver coil 6 may be configured in such a manner that: the radio frequency coil subsidiary part 6*a* according to the above-described embodiment is not provided with the extended portions 24; a coil element corresponding to the extended portions 24 are embedded in the couchtop 8*a*; and this coil element and the radio frequency coil subsidiary part 6*a* is connectible via the connector 6*c* and the connector 20. For this reason, an embodiment thus configured is described next as a first modification according to the embodiment. The same reference signs are assigned to components having the same configurations as those in the above-described embodiment, and description thereof may be omitted.

Figure 14:
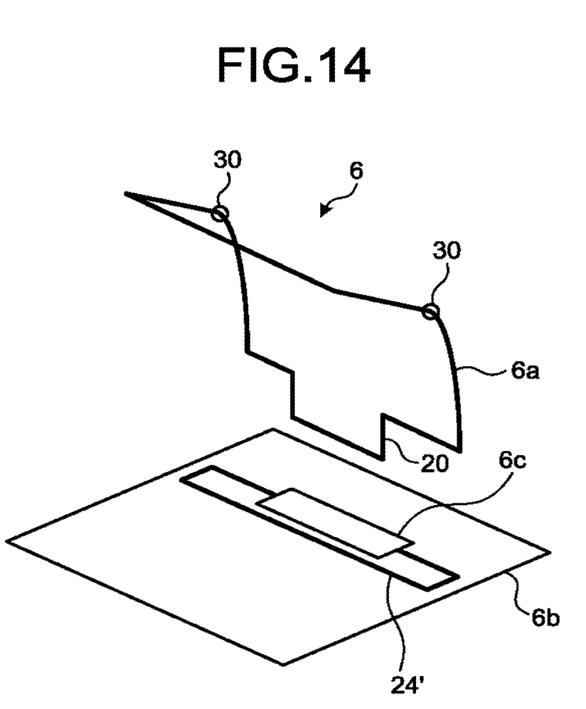
FIG. 14 is a diagram for explaining an example of a receiver coil according to a first modification.

FIG. 14 is a diagram for explaining an example of a radio frequency coil element of the receiver coil 6 according to the first modification. As illustrated in the example in FIG. 14, a radio frequency coil element in the receiver coil 6 according to the first modification includes: the radio frequency coil subsidiary part 6*a* not provided with the extended portions 24; the radio frequency coil main part 6*b*; and a coil element 24' corresponding to the extended portions 24 that is positioned so as to overlap the radio frequency coil main part 6*b*.

In the example in FIG. 14, when the connector 20 is connected to the connector 6*c* of the radio frequency coil subsidiary part 6*a*, the coil element 24' is connected sc as to form one loop together with the radio frequency coil subsidiary part 6*a*. At the same time, in the example in FIG. 14, the coil element 24' is arranged while being embedded in the couchtop 8*a* so that a region formed by the loop of the radio frequency coil main part 6*b* can overlap a region formed by the coil element 24'. Under these conditions, the coil element 24' provides the same functions as the above-described extended portions 24. Consequently, decoupling can be brought about between the radio frequency coil subsidiary part 6*a* and the radio frequency coil main part 6*b* that has the coil element 24' connected thereto. That is, coupling can be prevented between the radio frequency coil subsidiary part 6*a* and the radio frequency coil main part 6*b*.

The receiver coil 6 according to the first modification is as described above. The radio frequency coil subsidiary part 6*a* included in the receiver coil 6 according to the first modification is fit with the connector 6*c* and thereby joined with the radio frequency coil main part 6*b* embedded in the couchtop 8*a*, thereby being connected to the coil element. 24' so as to form one loop together with the coil element 24', thereby forming, the coil element 24' having been arranged so as to overlap the radio frequency coil main part 6*b*. The radio frequency coil subsidiary part 6*a* thus forms a cable-free RF coil that corresponds to one area to be imaged of a subject S. As a result, the receiver coil 6 according to the first modification and the MRI apparatus 100 that includes the receiver coil 6 according to the first modification, as described above, make it possible to prevent the coupling.

Although the above-described embodiment describes an example in which the radio frequency coil main part 6*b* is embedded in the couchtop 8*a*, it is not necessary that the radio frequency coil main part 6*b* be embedded in the couchtop 8*a*.

The receiver coil 6 and the MRI apparatus 100 according to at least either of the embodiment and the modification that are described above make it possible to prevent coupling between the radio frequency coil subsidiary part 6*a* and the radio frequency coil main part 6*b*.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A couchtop attachment-detachment type RF coil comprising:
    a connector embedded in a couchtop of a magnetic resonance imaging apparatus; and
    a first coil element including a loop including a bent portion, and
    configured to:
    be attachable to and detachable from the connector, and
    form a cable-free RF coil by being fitted with the connector and thereby joined with a second coil element embedded in the couchtop, the cable-free RF coil corresponding to one area to be imaged of a subject, wherein
    the bent portion and the second coil element are coplanar after the couchtop attachment-detachment type RF coil has been fit with the connector.

2. The couchtop attachment-detachment type RF coil according to claim 1, wherein the connector is arranged inside a loop of the second coil element embedded in the couchtop.

3. The couchtop attachment-detachment type RF coil according to claim 1, wherein
a size of the bent portion is designed on the basis of a size of a loop, as a whole, of the second coil element embedded in the couchtop.

4. The couchtop attachment-detachment type RF coil according to claim 1, wherein a plurality of coil elements are embedded in the couchtop so as to correspond to any of at least two areas to be imaged.

\* \* \* \* \*